United States Patent
Sayyah (12)

(10) Patent No.: US 6,291,266 B1
(45) Date of Patent: Sep. 18, 2001

(54) METHOD FOR FABRICATING LARGE AREA FLEXIBLE ELECTRONICS

(75) Inventor: Keyvan Sayyah, Santa Monica, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 09/728,639

(22) Filed: Nov. 29, 2000

(51) Int. Cl.$^7$ .................................................... H01L 21/44
(52) U.S. Cl. ......................... 438/107; 438/455; 438/459; 438/30
(58) Field of Search ..................................... 438/107, 455, 438/30, 459; 257/618; 156/655.1

(56) References Cited

U.S. PATENT DOCUMENTS 5,545,291 * 8/1996 Smith et al. ..................... 156/655.1
5,783,856 * 7/1998 Smith et al. ........................ 257/622
5,904,545 * 5/1999 Smith et al. ........................ 438/455

OTHER PUBLICATIONS

Böhringer, K.F., et al., "Electrostatic self-assembly aided by ultrasonic vibration," Presented at the American Vacuum Society 44th Annual Symposium, San Jose, CA, Oct. 1997, pp. 1–2.

Carey, P.G., et al., "Poly-Si Thin Film Transistors Fabricated On Plastic Substrates," *IEEE*, 1998, pp. 126–127.

Drobac, S., "Fluidic Self-Assembly Could Change The Way Fpd's Are Made," *Information Display*, Nov. 1999, pp. 12–16.

* cited by examiner

Primary Examiner—David Nelms
Assistant Examiner—Thao Phuong Le
(74) Attorney, Agent, or Firm—Ladas & Parry

(57) ABSTRACT

A method for transferring of individual devices or circuit elements, fabricated on a semiconducting substrate, to a new substrate and placing said devices and elements in predetermined locations on the new substrate. The method comprises shaping the devices and circuits as truncated cones, lifting them off the original semiconducting substrates and depositing them en masse onto the new substrate, followed by their placing into receptors on the new substrate. The new substrate has preliminarily made receptors in a form of a truncated cone and the devices and circuits fill these receptors. Both the receptors and the devices and circuits have metallization contacts enabling to establish electrical contact between them. A method for real-time monitoring and verification of correctness of placement of the devices and circuits into the receptors by applying voltage pulse waveforms and measuring the resulting current pulse.

21 Claims, 3 Drawing Sheets

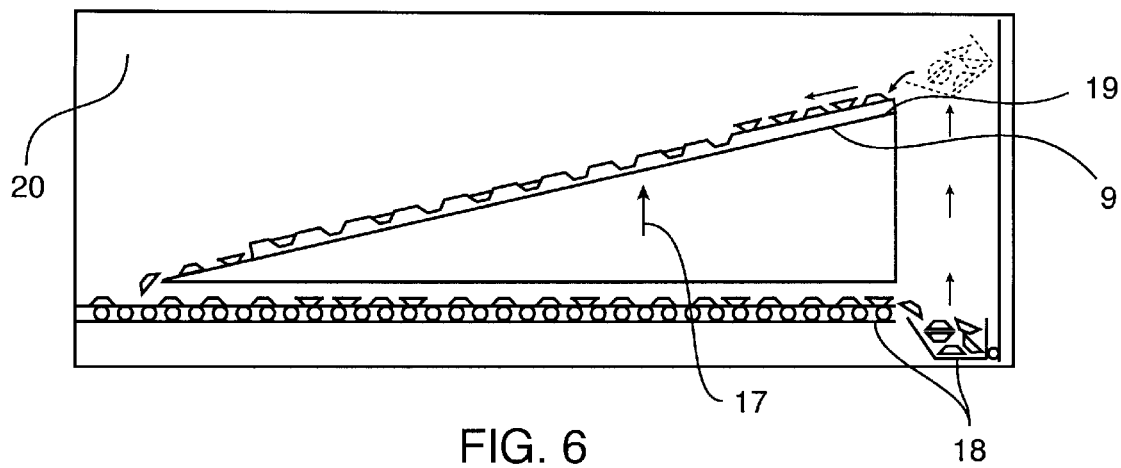
FIG. 6
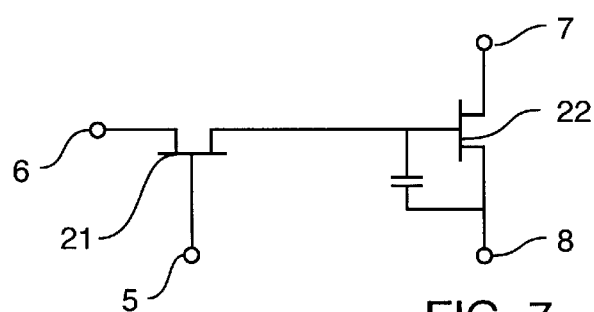
FIG. 7
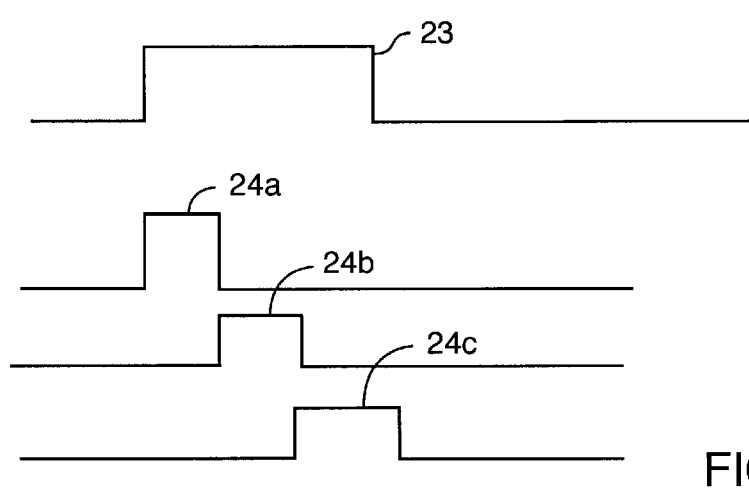
FIG. 8
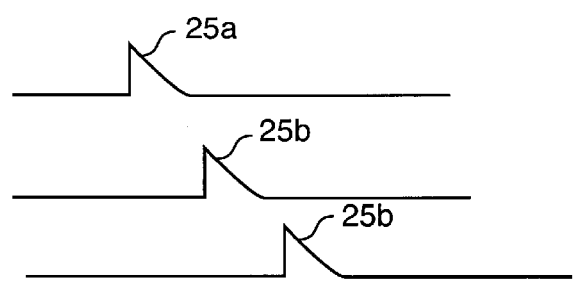

METHOD FOR FABRICATING LARGE AREA FLEXIBLE ELECTRONICS

BACKGROUND OF THE INVENTION

1. Field of the Invention

This invention relates generally to a method for placement of individual circuit elements, including pixels, on a new substrate.

The subject of this invention is a method for the transfer and placement of individual circuit elements or devices fabricated on a semiconductor substrate to predetermined locations in a new substrate of any material, shape and size, as well as in-situ electrical monitoring to make sure that all elements have been properly placed in these locations.

More particularly, the invention comprises a method by which individual circuit elements are epitaxially lifted off a seed substrate and placed in predetermined and arbitrary circular holes, or receptors, on a new substrate.

2. Description of the Related Art

In the prior art, the positioning of individual elements into predetermined locations in a new substrate (following the lifting these individual elements off the original seed substrate) is achieved using submersion of these elements and the new substrate into a fluid and allowing the fluid flow to transfer the elements to the receptor sites.

The liquid submersion method has three key drawbacks:

(1) the liquid submersion of the individual elements and the new substrate precludes the use of in-situ electrical monitoring for the realtime determination of the correctness of placement of the individual elements in the receptors;

(2) the liquid submersion also precludes the placement of various adhesives for the proper electrical attachment of the individual elements to the receptors; and (3) the square-shaped elements and receptors described for this method are inadequate because the possibility is reduced that they be placed in the receptors correctly.

Another method for transferring individual circuit elements fabricated on one substrate to different locations on a new substrate comprises transferring these elements to a stretchable membrane via the epitaxial liftoff process, followed by stretching the membrane to position and bond the circuit elements to their new locations. Following this bonding, the membrane layer is then released.

The obvious disadvantage of the stretchable membrane technique is the inability to position the individual circuit elements to any arbitrary location on the new substrate due to the limitations of the stretchable membrane. Also this technique involves a double transfer process in which the circuit elements are first attached to the membrane before being stretched and bonded to the new substrate, thus decreasing the fabrication yield.

There is a need for a method for transferring individual circuit elements fabricated on one substrate to different locations on a new substrate without the drawbacks and disadvantages described above. The present invention discloses such a method, and the individual circuit elements can be transferred to any arbitrary location on the new substrate as well as checked in-situ for their proper electrical placement before the final bonding as described below.

SUMMARY OF THE INVENTION

The present invention is directed to a method used to lift individual circuit elements off a seed substrate and to place these individual circuit elements in receptors on the new substrate, using gravitational forces and vibrational energy.

The present invention is also directed to the technique used for realtime electrical verification of whether the placement of these elements in the receptors is correct. The realization of this concept allows transfer of electrical circuitry fabricated on an original substrate to a new substrate made of any material, and having any shape and size. One such example would be the realization of large area active matrix circuits on flexible substrates for displays as described hereinafter.

The method also allows the transfer of devices or circuits fabricated on a substrate made of one type of material to a substrate made of a different type of material. For instance, using this method, arrays of microelectromechanical switches (MEMs) operating in the radio-frequency regime together with their associated integrated electronics can be transferred to a large flexible antenna aperture.

Another example of particularly beneficial application of this invention pertains to the technology of large area active matrix displays. Millions of active matrix driver pixels can be prefabricated on a silicon substrate using conventional foundry processing, and then transferred to a large sheet of glass or plastic substrate as described in detail below. Flexible and conformal displays for automobiles are yet other examples of application of the method of this invention.

One of the main advantages of the method of this invention is the realization of large area electronics on flexible and lightweight plastic carriers (such as large area flexible active matrix displays) with the circuits or devices prefabricated on a crystalline semiconductor substrate (such as silicon). According to a competing technology, the devices and circuitry are fabricated on plastic carriers by means of deposited polycrystalline semiconductors which have inferior electrical characteristics compared to those fabricated on single crystal silicon. The proposed technology of this invention is superior to the competing technology mentioned above.

The circuit elements are epitaxially lifted off a seed substrate first. Then, using gravitational force and vibrational energy in a controlled environment, the circuit elements are allowed to slide down the new substrate raised from one end at a predetermined and preferably, at an optimum angle. The circuit elements lifted off the original seed substrate are preferably in the shape of a truncated cone for easy placement in holes in the new substrate which also have the same matching shape.

The resulting circular symmetry allows easy placement of the circuit elements in the receptors independent of their lateral orientation. The subsequently described unique concentric ringshaped electrode pattern and its circular symmetry allows easy placement of the elements into the receptors and proper electrical contact between them, independent of their lateral orientation, when they arrive at these sites compared to the square-shaped elements and receptors known in prior art because the shape of square reduces the possibility of the correct placement of the elements in these sites.

Metal interconnection between the individual circuit elements and the new substrate is achieved by contact between circularly symmetric terminations on the bottom of each element and their corresponding connections prefabricated on the new substrate inside the receptors. Using these interconnections, the electrical contact between each circuit element and other circuitry prefabricated on the new substrate can be electrically verified in real time as the individual elements fall into the receptors.

One aspect of the invention provides a method for transferring individual circuit elements fabricated on an original semiconductor substrate to arbitrary predetermined locations on a new substrate, the method comprising steps of providing said original semiconductor substrate with a release member disposed upon a surface of said original semiconductor substrate, said individual circuit elements having been fabricated on top surface of said release member; forming circular individual circuit elements around said individual circuit elements; shaping said circular individual circuit elements in a conical frustum shape; fabricating a first set of metallization contacts on top of smaller circular surface of said conical frustum, said first set of metallization contacts being concentrically disposed rings defining space therebetween; freeing said conical frustum-shaped individual circuit elements by removing said release member; providing a new substrate having conical frustum-shaped individual circuit elements receptors, said receptors having an inside area defined by a curved inside wall, a top circular opening on a surface of said new substrate, and an inside circular surface, said inside circular surface being defined as the bottom of said receptors, said top circular opening being disposed oppositely to said inside circular surface, said top circular opening having a diameter larger than a diameter of said inside circular surface, said receptors having a volume of said inside area larger than a volume of said conical frustum-shaped individual circuit elements; fabricating a second set of metallization contacts on said inside circular surface, said second set of metallization contacts being concentrically disposed rings defining space therebetween, said second set of metallization contacts arranged so as to match said first set of metallization contacts; applying and partially curing an electrically conductive resin inside said receptors so as to cover only said bottom of said receptors; raising said new substrate to an incline, with one end of said new substrate being higher than an opposite end of said new substrate; pouring said freed conical frustum-shaped individual circuit elements onto the higher end of the surface of said new substrate having said receptors followed by shaking said new substrate so that said freed conical frustum-shaped individual circuit elements roll down the inclined new substrate and are trapped inside said receptors and said rings of said first set of metallization contacts being in contact with corresponding rings of said second set of metallization contacts; removing untrapped and/or improperly trapped conical frustum-shaped individual circuit elements that have rolled down to said opposite end of the inclined new substrate from said surface of said new substrate and placing said untrapped conical frustum-shaped individual circuit elements onto said surface of said new substrate; repeating said shaking followed by said step of removing until all said receptors are filled with said conical frustum-shaped individual circuit elements and completing said curing of said electrically conductive resin inside said receptors.

Another aspect of the invention provides a method for monitoring and correcting following the transferring of the individual circuit elements, the method for monitoring and correcting comprising steps of applying voltage pulse waveforms to the second set of metallization contacts; measuring a current pulse generated as a result of applying of the voltage pulse waveforms and repeating the steps of applying of the voltage pulse waveforms and of measuring of the current pulse with each receptor.

BRIEF DESCRIPTION OF THE DRAWINGS

The features and advantages of the present invention will be better understood with regard to the following description, appended claims, and accompanying drawings where

FIG. 6 is a schematic diagram showing an inclined position of a substrate for transfer of the circuit elements aided by vibrational energy.

FIG. 7 is a schematic diagram showing two-transistor active matrix circuit for driving LEDs.

FIG. 8 is a schematic diagram showing row and column voltage and current pulses for verifying proper electrical contact between the circuit elements and the receptors.

DETAILED DESCRIPTION OF THE INVENTION

The present invention comprises a method for placing individual devices or circuit elements fabricated on a semiconductor substrate (hereinafter an "original substrate" or a "seed substrate") in predetermined locations on another substrate (hereinafter a "new substrate"), and a method for in-situ electrical monitoring of whether these elements are correctly placed in the their new location. These methods are described in detail below.

First, the device or circuit elements are fabricated on an original substrate using conventional device and circuit fabrication processes. These fabrication processes are known to those skilled in the art.

Figure 1:
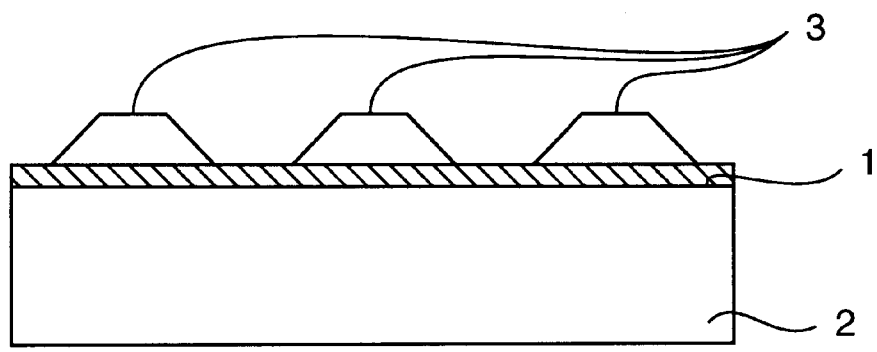
FIG. 1 is a schematic diagram showing truncated cone-shaped circuit elements formed on top of a release layer.

In a preferred embodiment, a release layer 1 is disposed on top of original substrate 2, and the device or circuit elements are fabricated on top of the release layer 1, as shown in FIG. 1. For example, a silicon-on-insulator (SOI) substrate is preferably used as an original substrate 2, and the device or circuit elements are fabricated on such SOI substrate, where a silicon oxide layer beneath an active top silicon layer would serve as the sacrificial release layer 1.

Alternatively, a group III–V semiconductor substrate can also be used, provided an etch-stop layer is first deposited between the device layer and the substrate layer. Manufacturing of such etchstop layer is conducted according to common methods known to those skilled in the art. An illustration of such etch-stop layer can be an AlAs etch-stop layer sandwiched between a gallium arsenide substrate and a gallium arsenide device layer.

The method which is the subject of the present invention, described in detail hereinbelow, will remain the same for both the preferred SOI substrate and for the alternative group III–V semiconductor substrate.

Following the fabrication of the device or circuit elements 3, circular individual circuit elements around these elements are formed via standard lithographic and dry etching techniques in order to isolate the individual circuit elements. Dry etching is the preferred technique for realizing the truncated cone shaped individual circuit elements subsequently described. The etching method used is preferably an isotropic etching.

For the purposes of this invention, the term "circular individual circuit elements" means "individual circuit elements having a shape with a circular cross-section."

The isotropic etching of the original substrate 2 between the device or circuit elements leads to the formation of individual circuit elements 3 in the shape of a truncated right circular cone, preferably, conical frustum as shown in FIG. 1. Individual circuit elements 3 can be manufactured of any size which may be required in a particular application. As the lateral dimension of individual circuit elements is increased, their thickness is also increased proportionally, so that when the individual circuit elements 3 are released from the original substrate 2, as subsequently described, they would not curl up. A ratio of the lateral diameter of an individual circuit element 3 to its thickness is preferably within a range of between about 10:1 and about 50:1.

If the device or circuit elements are fabricated on top of a release layer 1, the truncated cone-shaped pixels 3 are confined between the top surfaces of the device layer and the release layer 1.

If the entire bulk of the seed substrate 2 is etched to define the isolated individual circuit elements 3 without the presence of a release layer 1, a temporary carrier is first attached to the original substrate 2, using a removable adhesive. A solid black wax is a preferred removable adhesive, Apiezon Wax W manufactured by M&I Materials, Ltd. of Manchester, United Kingdom, being the more preferred removable adhesive. Any material inert to the etching solution is suitable to be used as the temporary carrier.

Etching of the entire bulk of the seed substrate 2 is particularly preferred when the individual circuit elements 3 have large lateral diameters, in order to decrease the ratio between the lateral diameter and the thickness of the individual circuit element 3 and thus to improve the mechanical stability of the latter.

Figure 2:
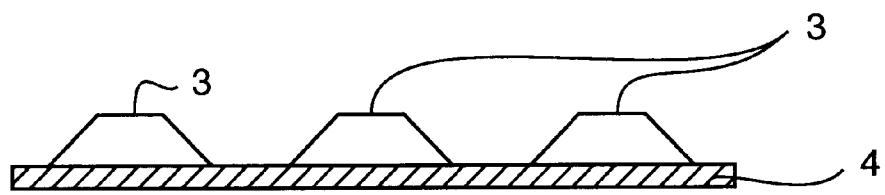
FIG. 2 is a schematic diagram showing truncated cone-shaped circuit elements formed on top of a release tape.

Alternatively, instead of the temporary carrier, a release tape 4 can be first attached to the original substrate 2, as shown in FIG. 2.

Following the formation of truncated-cone shaped individual circuit elements 3, metallization contacts or electrodes in the form of concentric rings are fabricated on these elements in order to provide subsequent electrical contact of these individual circuit elements 3 to a new substrate.

Standard metal deposition methods are used to form the metallization contacts, such as deposition by evaporation or sputtering followed by etching using a photolithographic mask. These methods are common and well known to those skilled in the art. Non-oxidizing metals are preferred materials to fabricate the metallization contacts, gold being more preferred metal. Alternatively, other standard metals used to fabricate integrated circuits, such as aluminum or titanium-tungsten, are also acceptable metals and can be used likewise.

Figure 3:
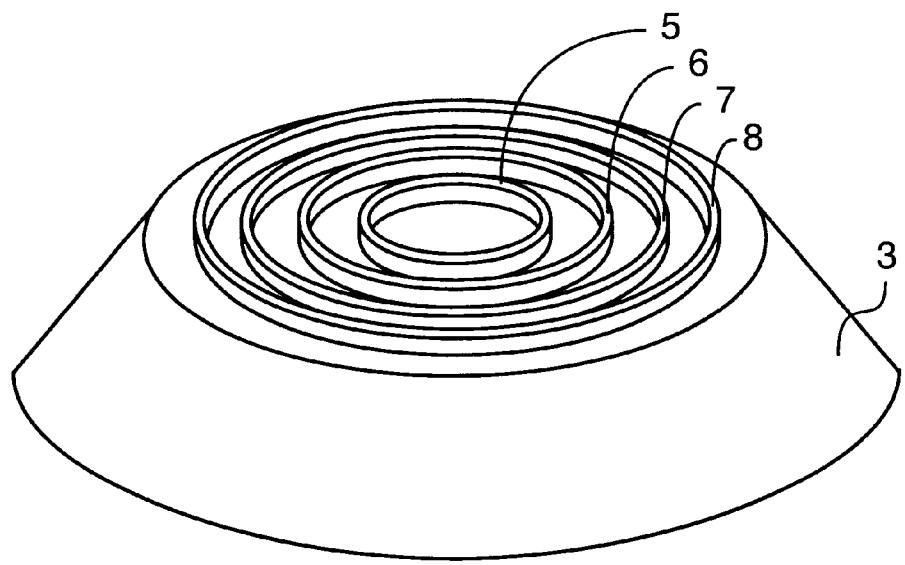
FIG. 3 is a schematic diagram showing concentric ring-shaped electrodes formed on the top surface of the circuit elements.

These ring-shaped electrodes preserve the circular symmetry of the individual circuit element 3 so as to make subsequently described placement of the individual circuit element 3 in the receptors 10 easy. In one embodiment of this invention, where active matrix array pixels for displays are formed and transferred, four concentric contact rings (for row connection 5, for column connection 6, for display element connection 7, and for ground connection 8) are formed on the top surface of the individual circuit elements as shown in FIG. 3.

Following the fabrication of the metallization contacts, the release layer 1 or temporary carrier, or the release tape 4 is removed, thus freeing the truncated cone-shaped individual circuit elements 3 containing the individual device or circuit elements.

In case of the SOI material being the original substrate 2, the release layer 1 is the oxide layer beneath the active layer, as mentioned above. The release layer 1 is etched in a buffered solution of hydrofluoric acid, according to standard etching techniques known to those reasonably skilled in the art, to release the predefined individual circuit elements 3.

Figure 4:
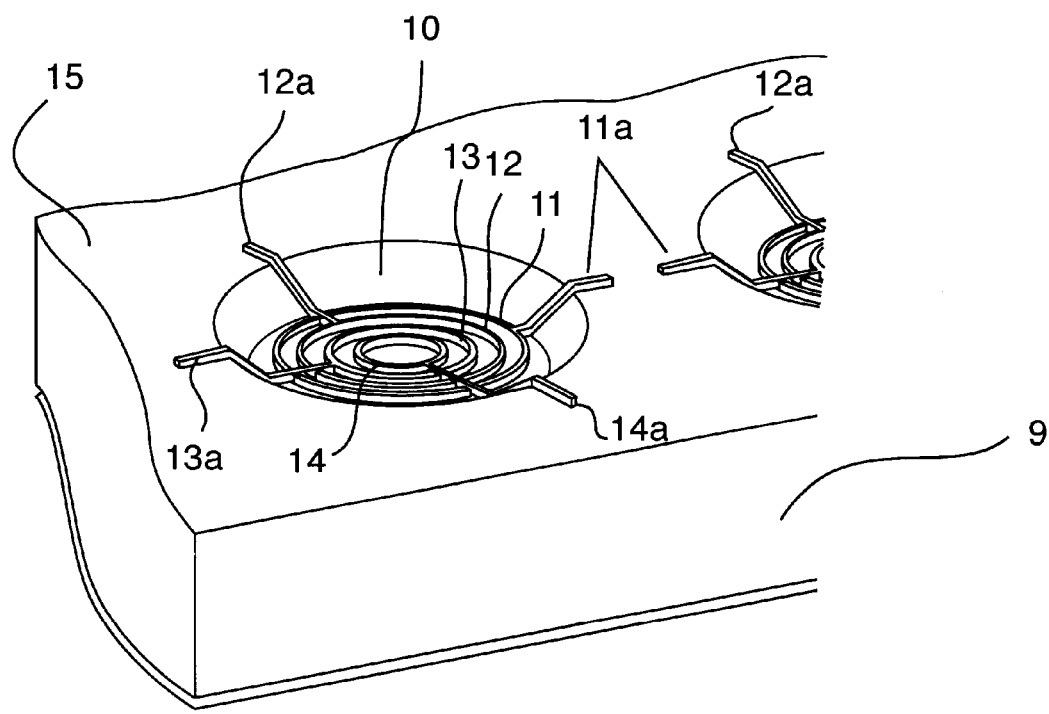
FIG. 4 is a schematic diagram showing predefined circular receptors in new substrate with matching ring contacts.

The new substrate 9, into which these individual circuit elements will 3 be finally placed, comprises predefined holes or receptors 10 in the same shape of truncated cones as the individual circuit elements 3 which the receptors 10 will receive, the receptors 10 having slightly bigger, preferably, between about 5% to about 10% bigger, dimensions to accommodate the individual circuit elements 3, as shown in FIG. 4. The larger circular plane of the truncated cone-shaped receptor forms an opening in the surface of the new substrate, and the smaller circular surface faces the inside of the receptor.

The new substrate onto which the individual circuit elements 3 are transferred can be of any size or shape. The new substrate can be made of any material, for instance, another semiconductor material, various kinds of glass or plastic suitable for flexible electronic. The holes 10 are formed in the new substrate by a variety of methods, comprising, but not limited to, etching, stamping and laser machining. Metallization contacts in the form of concentric rings 11–14 are also formed inside the receptors 10 in the new substrate 9 matching the contact electrodes formed in the individual circuit element elements 3 described above, as seen in FIG. 4.

Shown in FIG. 4 are the four concentric electrodes 11–14 for the embodiment mentioned above (in which embodiment active matrix array pixels for displays are formed and transferred), these four concentric electrodes 11–14 formed inside the truncated cone-shaped receptors in a special pattern to avoid crossing of the electrodes.

The concentric ring 11 matches the ground contact 8, the concentric ring 12 matches the display contact 7, the concentric ring 13 matches the column contact 6, and the concentric ring 14 matches the row contact 5.

It is clear from FIG. 4 that the electrodes 11–14 intersect contacts 5–8. In order to avoid the interference between the electrodes 11–14 and the contacts 5–8, the electrodes 11–14 are coated with an electrically insulating layer, preferably, of silicon dioxide, which is deposited on top of the crossing portion only of the electrodes 11–14 according to methods known to those skilled in the art.

Electrodes 11–14 are fabricated inside the receptors 10 using standard processes for metal pattern fabrication known to those skilled in the art. These processes comprise metal deposition via evaporation and sputtering followed by lithographically defined pattern for wet or dry etching.

The contacts 11–14 continue to the top surface 15 of the new substrate 9 connecting them to other circuitry or metallization formed on this surface 15. For this particular embodiment, these continuations 11a, 12a, 13a, and 14a of the rings 11–14 are formed on the surface 15, as shown on FIG. 4.

Figure 5:
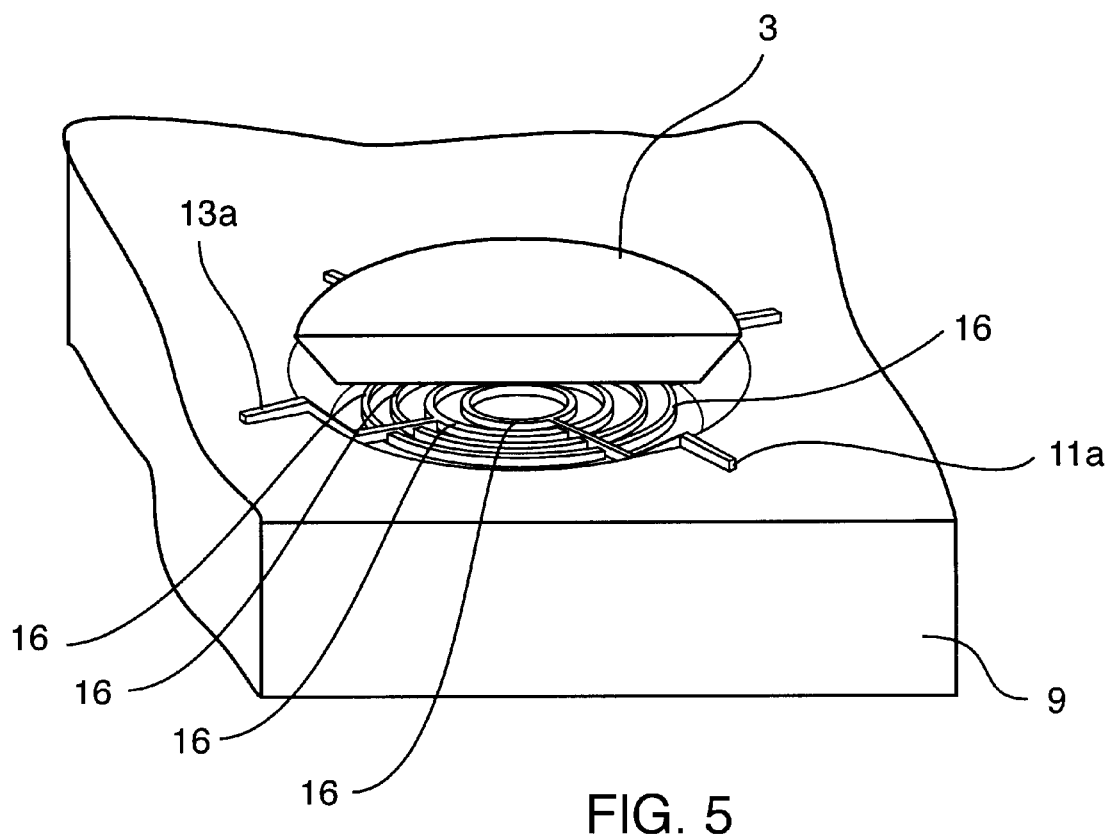
FIG. 5 is a schematic diagram showing Z-axis epoxy for vertical contact between the contact rings in the receptors and on the elements.

Once the electrodes 11–14 are formed, a one-dimensional conductive epoxy resin 16, referred to as the Z-axis epoxy 16, is placed inside the receptors 10, as shown on FIG. 5. Commercially manufactured Z-axis epoxy resins are available, the resin ZXUV-102 manufactured by Zymet Corporation being a preferred Z-axis epoxy resin.

The thickness of Z-axis epoxy resin 16 is determined by the diameter of the metallic (or metal coated polymer) microspheres suspended in the resin. The diameter of said microspheres is preferably within a range of between about 5 micrometers and about 12 micrometers. After the individual circuit elements 3 have fallen properly into their receptors, as subsequently discussed, with the Z-axis epoxy resin in between, slight pressure extended on a circuit element 3 establishes electrical contact between the ring electrodes 5–8 and their corresponding counterpart contacts 11–14. Such electrical contact is established through the conductive particles contained within the Z-axis epoxy resin 16.

One method of applying this slight pressure is by using the pressure from the inert gas 20 inside the enclosure where the assembly is placed, as discussed below.

Both the top surface 15 covered with photoresist and the inside of the receptors 10 of the new substrate 9 are initially coated with this Z-axis epoxy 16 and then, using a photoresist liftoff technique, the excess epoxy is removed and the Z-axis epoxy 16 is retained only inside the receptors 10, mainly on the bottom of the receptors and some on the side walls. Standard photoresist liftoff techniques known to those skilled in the art are used. Alternatively, a stenciling technique can be used to deposit the Z-axis epoxy only in the receptors 10.

The Z-axis epoxy 16 is preferably applied by a method of automatic dispensing using a moving epoxy dispenser. This method allows to achieve uniform coverage of the epoxy both inside and outside the receptors. Alternatively, the Z-axis epoxy can be applied by other methods, such as stenciling or spraying. The preferred method of curing is by ultra-violet radiation. Alternatively, for substrates blocking the ultra-violet radiation, thermal curing can be used.

The Z-axis epoxy 16 comprises small gold-coated spherically shaped polymers embedded inside an epoxy material with low enough concentration, preferably between about 500 and about 2,500 spheres per square millimeter, of these spheres to result in conductivity only in the vertical direction (Z-axis), thus preventing the ring electrodes from shorting laterally. The Z-axis epoxy 16 is therefore electrically insulating in the lateral (X and Y-axis) directions.

There is only one microsphere (embedded in the matrix resin) between the two contacting surfaces in the vertical direction, that is, between the ring electrodes and corresponding contacts on the receptors 10, after compressing pressure of between about 0.5 and about 1.0 gram per particle is applied. The diameter of one sphere determines the distance between the two contacting surfaces.

The Z-axis epoxy 16 enables vertical contact between the concentric ring-shaped electrodes 5–8 of the individual circuit element and those 11–14 of the receptors without shorting the electrodes laterally.

Once the conical frustum-shaped individual circuit elements 3 are separated from each other by removing the release layer 1, they are shaken off the original substrate 2, collected in a container (not shown) and are placed along one side of the new substrate 9, as shown in FIG. 6, followed by pouring of the individual circuit elements 3 onto the new substrate 9.

A fraction of these individual circuit elements 3 will land on their smaller diameter side while the rest land on the side with the larger diameter as the elements are dropped on the side of the new substrate 9 which is raised to an optimum incline angle, preferably between about 30° and about 60°, as shown on FIG. 6.

By preferably applying an appropriate vertical vibrational (ultrasonic) energy to assist their movement in the direction 17, the truncated cone-shaped individual circuit elements 3 slide down the ramped new substrate 9 and gradually fill up the receptors 10 if positioned in the right orientation (the large diameter side facing up). Such ultra-sonic energy can be obtained using any appropriate commercially available ultrasonic generator. Alternatively, vibrations having non-ultrasonic frequencies can be used.

Once the free individual circuit elements that have not filled any receptor 10 site reach the bottom of the ramp, they are recycled and transferred by a motorized mechanism 18 to the top of the ramp 19 to start a new cycle of sliding down the ramp 19 to fill up the remaining empty receptors 10, as shown on FIG. 6. By placing approximately a number of individual circuit elements 3 which is 5–10 times greater than the total number of receptors 10, and by recycling the untrapped individual circuit elements, all the receptors 10 will be filled after a few cycles. The circularly symmetric shape of the receptors 10 and that of the individual circuit elements 3 allows easy filling of the holes independent of the lateral orientation of the elements when they approach the receptor sites. The entire assembly is placed inside an enclosure filled with a small flow of an inert gas 20 (such as nitrogen) to provide a controlled environment for this individual circuit element transfer and placement process.

Another aspect of this invention relates to a technique for real-time monitoring and verification of the correct filling of the receptors 10 with the conical frustum-shaped individual circuit elements 3. According to this technique, voltage pulse waveforms are externally applied to the lines 11a–14a on the top surface 15 of the new substrate 9 connecting to the concentric ring electrodes 11–14 inside the receptors 10. The resulting measured current pulse between these electrodes 11–14 and a common electrode contacting the individual circuit elements, such as ground electrode, is an indication of electrical contact between a ring electrode and its corresponding contact point on the individual circuit element.

This voltage pulse waveform is sequentially applied to the electrodes of all the receptor sites 10 with their corresponding current pulse monitored throughout the period of the cyclic travel of the individual circuit elements 3 down the ramp 19.

In the case where the individual circuit elements 3 fall into the receptors 10 at a wrong angle preventing intimate contact of electrodes 5–8 fabricated in the individual circuit elements 3 with the corresponding electrodes 11–14 inside the receptors 10, these individual circuit elements 3 are shaken out of the receptors 10 by applying an appropriate vibrational energy and recycling them for proper placement. This vibrational shaking should not affect the individual circuit elements 3 that have fallen properly into the receptors and hence are contacting the Z-axis epoxy 17 due to the surface tension as well as the sticky nature of the epoxy.

The technique described above is general and applies to individual circuit element elements 3 with any circuit configuration. For a particular embodiment of this invention described above (where the individual circuit elements 3 are active matrix circuits for driving display elements, such as organic LEDs or LCDs), this testing technique is shown schematically in FIG. 7. In this embodiment, a two transistor active matrix circuit for driving LEDs, described above, there are four concentric ring contacts for the row 5 (select), column 6 (data), display element drive 7, and ground electrodes 8, as shown in FIG. 3.

Matching ring contacts 11–14 are also formed inside the receptor sites 10 connecting to the row 5, column 6, display 7, and ground 8 ring electrodes of the individual circuit element. Two voltage pulse waveforms 23 and 24a–24c are applied to the row 14a and column 13a lines sequentially addressing each individual circuit element 3 in the display.

The individual circuit element also comprises a switching transistor 21 and a drive transistor 22. The resulting switching transistor 21 drain current pulse measured in the column 6 line of the individual circuit element 3 is a confirmation of proper contact between the row 5, column 6, and ground 8 terminals of that individual circuit element 3 and their corresponding terminals 11, 12 and 14 inside the receptor 10.

For example, the first row is activated with a voltage pulse waveform 23, as shown in FIG. 8. Column pulse voltages 24a–24c are then applied to each column of the display sequentially within the duration of the row pulse waveform as shown on FIG. 8.

The current pulse 25a–25c flowing through each column terminal (and ground or common terminal) is measured during the time frame of that column pulse waveform. Only three column pulse waveforms are shown on FIG. 8 for the purposes of illustration. Generally, any number of columns and corresponding number of column pulse waveforms can be used.

Voltage applied to row electrodes is higher than the threshold voltage of the switch transistor 21. Voltage applied to the column electrodes is preferably within a range of between 2 Volts and about 5 Volts.

The duration of the pulse waveform applied to the row electrodes ($T_{row}$) is the time for one cycle of the individual circuit elements, sliding down the ramp in the attempt to fall into the receptors, divided by the number of row electrodes. The period of the row pulse is the time of one such cycle.

The duration of the pulse waveform applied to the column electrodes is $T_{row}$ divided by the number column electrodes. The period of the column pulse is again the time of one cycle mentioned above.

The presence of this current 25a–25c is a verification that the three terminals (column, row and ground) of that individual circuit element confined by the said row and column are making proper contact to their counterparts in the receptor. This process is continued for all the columns, and hence individual circuit elements, of that row, and then repeated for all rows in the display. In this manner, the proper electrical contact of all the individual circuit elements can be quickly verified externally within a very short time in an automated fashion. This contact verification scan can be performed after each cycle of the down ramp travel of the individual circuit element elements until all the receptors are filled and make proper electrical contact to their corresponding terminals in the receptors. At this point, the Z-axis epoxy 16 can be cured using UV radiation, thus freezing the individual circuit elements in their receptors with full electrical contact.

Having described the invention in connection with several embodiments thereof, modification will now suggest itself to those skilled in the art. As such, the invention is not to be limited to the described embodiments except as required by the appended claims.

I claim:

1. A method for transferring individual circuit elements fabricated on an original semiconductor substrate to arbitrary predetermined locations on a new substrate, said method comprising steps of:
   (a) providing said original semiconductor substrate with a release member disposed upon a surface of said original semiconductor substrate, said individual circuit elements having been fabricated on top surface of said release member;
   (b) forming circular individual circuit elements around said individual circuit elements;
   (c) shaping said circular individual circuit elements in a conical frustum shape;
   (d) fabricating a first set of metallization contacts on top of smaller circular surface of said conical frustum, said first set of metallization contacts being concentrically disposed rings defining space therebetween;
   (e) freeing said conical frustum-shaped individual circuit elements by removing said release member;
   (f) providing a new substrate having conical frustum-shaped individual circuit elements receptors, said receptors having an inside area defined by a curved inside wall, a top circular opening on a surface of said new substrate, and an inside circular surface, said inside circular surface being defined as the bottom of said receptors, said top circular opening being disposed oppositely to said inside circular surface, said top circular opening having a diameter larger than a diameter of said inside circular surface, said receptors having a volume of said inside area larger than a volume of said conical frustum-shaped individual circuit elements;
   (g) fabricating a second set of metallization contacts on said inside circular surface, said second set of metallization contacts being concentrically disposed rings defining space therebetween, said second set of metallization contacts arranged so as to match said first set of metallization contacts;
   (h) applying and partially curing an electrically conductive resin inside said receptors so as to cover only said bottom of said receptors;
   (i) raising said new substrate to an incline, with one end of said new substrate being higher than an opposite end of said new substrate;
   (j) pouring said freed conical frustum-shaped individual circuit elements onto the higher end of the surface of said new substrate having said receptors followed by shaking said new substrate so that said freed conical frustum-shaped individual circuit elements roll down the inclined new substrate and are trapped inside said receptors and said rings of said first set of metallization contacts being in contact with corresponding rings of said second set of metallization contacts;
   (k) removing untrapped and/or improperly trapped conical frustum-shaped individual circuit elements that have rolled down to said opposite end of the inclined new substrate from said surface of said new substrate and placing said untrapped conical frustum-shaped individual circuit elements onto said surface of said new substrate;
   (l) repeating said shaking followed by said step of removing until all said receptors are filled with said conical frustum-shaped individual circuit elements; and
   (m) completing said curing of said electrically conductive resin inside said receptors.

2. The method according to claim 1, wherein in said step of providing said original semiconductor substrate, said original semiconductor substrate is made of a material selected from a group comprising a silicon-on-insulator substrate and a group III–V semiconductor substrate.

3. The method according to claim 1, wherein in said step of providing said original semiconductor substrate, said release member comprises a release layer, a temporary carrier or a release tape.

4. The method according to claim 1, wherein in said step of shaping said individual circuit elements, said shape of said conical frustum is achieved by a method comprising isotropic etching.

5. The method according to claim 1, wherein in said step of fabricating said first set of metallization contacts, said rings are made of a metal selected from a group comprising gold, aluminum, and titanium-tungsten.

6. The method according to claim 1, wherein in said step of providing said new substrate, said new substrate is made of a material selected from a group comprising semiconductor materials, glass, and plastic.

7. The method according to claim 1, wherein in said step of providing said new substrate, said volume of said receptors is between about 5% to about 10% larger than said volume of said conical frustum-shaped individual circuit elements.

8. The method according to claim 1, wherein in said step of fabricating said second set of metallization contacts, said metallization contacts are made of a metal selected from a group comprising gold, aluminum, and titanium-tungsten.

9. The method according to claim 1, wherein in said step of applying and partially curing said electrically conductive resin, said resin is selected from a group comprising epoxy resins.

10. The method according to claim 1, wherein in said step of applying and partially curing said electrically conductive resin, said resin is applied by a method comprising steps of:
 (a) coating said top surface of said new substrate and said inside area of said receptor with said electrically conductive resin; and
 (b) removing said electrically conductive resin from said new substrate and from said inside circular surface so that only said bottom remains coated with said electrically conductive resin.

11. The method according to claim 1, wherein in said step of raising said new substrate, said incline comprises an angle between about 30 degrees and about 60 degrees.

12. The method according to claim 1, wherein in said step of pouring and shaking of said freed truncated cone-shaped individual circuit elements, said shaking is achieved by applying vibrational or ultrasonic energy toward said new substrate.

13. The method according to claim 1, wherein in said step of removing of said untrapped and/or improperly trapped truncated cone-shaped individual circuit elements, said removing is achieved with a use of motorized mechanical means.

14. The method according to claim 3, wherein said temporary carrier is attached to said original semiconductor substrate using a removable adhesive, said removable adhesive comprising a wax.

15. The method according to claim 5, wherein said first set of metallization contacts are fabricated by a method comprising deposition by evaporation and sputtering followed by etching using a photolithographic mask.

16. The method according to claim 8, wherein said second set of metallization contacts is fabricated by a method comprising deposition by evaporation and sputtering followed by etching using a photolithographic mask.

17. The method according to claim 9, wherein said epoxy resins are Z-axis epoxy resins.

18. The method according to claim 1, further comprising a method for monitoring and correcting following said transferring of said individual circuit elements, said method for monitoring and correcting comprising steps of:
 (a) applying voltage pulse waveforms to said second set of metallization contacts;
 (b) measuring a current pulse generated as a result of said applying of said voltage pulse waveforms; and
 (c) repeating said steps of applying of said voltage pulse waveforms and of measuring of said current pulse with each receptor.

19. The method according to claim 18, further comprising, in case of absence of said current pulse, steps of:
 (a) said shaking of said new substrate;
 (b) said pouring of freed conical frustum-shaped individual onto the higher end of the surface of said new substrate circuit elements;
 (c) said removing of untrapped and/or improperly trapped conical frustum-shaped individual circuit elements;
 (d) said applying of said voltage pulse waveforms;
 (e) said measuring of said current pulse; and
 (f) repeating said steps (a)–(e) until all said receptors are properly filled with said conical frustum-shaped individual circuit elements.

20. The method according to claim 19, wherein in said step of shaking of said freed conical frustum-shaped individual circuit elements, said shaking is achieved by applying vibrational or ultrasonic energy toward said original substrate.

21. The method according to claim 20, wherein in said step of removing of said untrapped and/or improperly trapped conical frustum-shaped individual circuit elements, said removing is achieved with a use of motorized mechanical means.

* * * * *